United States Patent
Muraya et al.

(10) Patent No.: US 7,913,211 B2
(45) Date of Patent: Mar. 22, 2011

(54) LOGIC CELL CONFIGURATION PROCESSING METHOD AND PROGRAM

(75) Inventors: Keisuke Muraya, Kawasaki (JP); Akitaka Hoshimoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 434 days.

(21) Appl. No.: 12/149,453

(22) Filed: May 1, 2008

(65) Prior Publication Data
US 2008/0209371 A1    Aug. 28, 2008

Related U.S. Application Data

(63) Continuation of application No. PCT/JP2005/020071, filed on Nov. 1, 2005.

(51) Int. Cl.
*G06F 17/50* (2006.01)

(52) U.S. Cl. ............ 716/111; 716/120; 716/133; 703/16

(58) Field of Classification Search .................. 716/5, 2; 703/16
See application file for complete search history.

(56) References Cited

U.S. PATENT DOCUMENTS

| | | |
|---|---|---|
| 2001/0048325 A1 | 12/2001 | Ashida |
| 2003/0080802 A1 | 5/2003 | Ono et al. |
| 2005/0044515 A1 | 2/2005 | Acar et al. |

FOREIGN PATENT DOCUMENTS

| | | |
|---|---|---|
| JP | 7-161825 | 6/1995 |
| JP | 10-125908 | 5/1998 |
| JP | 11-511907 | 10/1999 |
| JP | 2001-320269 | 11/2001 |
| JP | 2002-170889 | 6/2002 |
| JP | 2003-100903 | 4/2003 |
| JP | 2003-142598 | 5/2003 |
| JP | 2004-134830 | 4/2004 |
| JP | 2005-71360 | 3/2005 |
| WO | WO 97/48061 | 12/1997 |

OTHER PUBLICATIONS

International Search Report mailed Jan. 31, 2006 in connection with the International application PCT/JP2005/020071.

*Primary Examiner* — Phallaka Kik
(74) *Attorney, Agent, or Firm* — Staas & Halsey LLP (57) ABSTRACT

A logic cell configuration processing method for a CMOS semiconductor is configured in which leak current per unit width equal for P-channel and N-channel MOS transistors, by calculating a probable average leak current, which is an expected value of leak current of the P-channel MOS transistor and the N-channel MOS transistor in the logic cell based on an input signal to be input to the logic cell; comparing a contribution of the P-channel MOS transistor with a contribution of the N-channel MOS transistor to the calculated probable average leak current; deciding the P-channel MOS transistor or the N-channel MOS transistor, whichever has a greater contribution, to be a low leak type MOS transistor; and adjusting ON current of the low leak type MOS transistor to be equal to ON current of the other MOS transistor.

17 Claims, 9 Drawing Sheets

| i | A | B | X | 1/N | Kp_I | Kn_I |
|---|---|---|---|-----|------|------|
| 1 | H | H | L | 1/4 | 2 | 0 |
| 2 | H | L | H | 1/4 | 0 | 1 |
| 3 | L | H | H | 1/4 | 0 | 1 |
| 4 | L | L | H | 1/4 | 0 | 0.15 |

| LOGIC CELL | N | Kp | Kn |
|---|---|---|---|
| INV | 2 | 1.0 | 1.0 |
| 2NAND | 4 | 2.0 | 2.2 |
| 2NOR | 4 | 2.2 | 2.0 |
| 3NAND | 8 | 3.0 | 3.5 |
| 4NOR | 8 | 3.5 | 3.0 |
| 3AOI | 16 | 4.0 | 5.1 |
| 3OAI | 16 | 5.1 | 4.0 |
| 4AOI | 8 | 13.0 | 13.6 |
| 4OAI | 8 | 13.6 | 13.0 |

FIG.9

| 2NAND | Wp | Wn | β | Ileak | IonP | IonN | Ion | Perf. | leak | Area |
|---|---|---|---|---|---|---|---|---|---|---|
| CONVENTIONAL STANDARD TYPE | 2.58 | 1.12 | 2.30 | 56.7 | 902 | 896 | 899 | 100% | 100% | 100% |
| CONVENTIONAL LOW LEAK TYPE | 3.01 | 1.28 | 2.35 | 21.9 | 902 | 896 | 899 | 86% | 39% | 116% |
| CONVENTIONAL HIGH-SPEED TYPE | 2.25 | 1.00 | 2.26 | 166.2 | 902 | 896 | 899 | 114% | 293% | 88% |
| LOW LEAK TYPE | 2.58 | 1.28 | 2.01 | 45.5 | 902 | 896 | 899 | 96% | 80% | 104% |
| HIGH-SPEED TYPE | 2.25 | 1.12 | 2.01 | 130.8 | 902 | 896 | 899 | 110% | 231% | 91% |
| LOW LEAK/HIGH-SPEED TYPE | 2.25 | 1.28 | 1.76 | 119.6 | 902 | 896 | 899 | 105% | 216% | 96% |

| | CELL | INV | 2 NAND | 2NOR | 3 NAND | 3NOR | 4 NAND | 4NOR | 3AOI | 3OAI | 4AOI | 4OAI |
|---|---|---|---|---|---|---|---|---|---|---|---|---|
| PERFORMANCE | LOW LEAK TYPE | 89.6% | 95.9% | 95.9% | 95.9% | 89.6% | 95.9% | 89.6% | 89.6% | 89.6% | 95.9% | 89.6% |
| | HIGH-SPEED TYPE | 103.5% | 109.5% | 109.5% | 109.5% | 103.5% | 109.5% | 103.5% | 103.5% | 103.5% | 109.5% | 103.5% |
| | LOW LEAK/ HIGH-SPEED TYPE | 92.4% | 104.6% | 104.6% | 104.6% | 92.4% | 104.6% | 92.4% | 92.4% | 92.4% | 104.6% | 92.4% |
| | CONVENTIONAL LOW LEAK TYPE | 86.2% | 86.2% | 86.2% | 86.2% | 86.2% | 86.2% | 86.2% | 86.2% | 86.2% | 86.2% | 86.2% |
| | CONVENTIONAL HIGH-SPEED TYPE | 113.7% | 113.7% | 113.7% | 113.7% | 113.7% | 113.7% | 113.7% | 113.7% | 113.7% | 113.7% | 113.7% |
| LEAK | LOW LEAK TYPE | 91.4% | 80.3% | 56.5% | 79.2% | 55.5% | 77.9% | 54.4% | 57.4% | 57.4% | 80.6% | 56.8% |
| | HIGH-SPEED TYPE | 159.5% | 230.6% | 156.5% | 227.2% | 153.3% | 223.3% | 149.8% | 159.5% | 159.5% | 231.7% | 157.6% |
| | LOW LEAK/ HIGH-SPEED TYPE | 116.9% | 215.7% | 113.0% | 206.3% | 108.8% | 201.1% | 104.2% | 116.9% | 116.9% | 212.4% | 114.5% |
| | CONVENTIONAL LOW LEAK TYPE | 38.6% | 38.6% | 38.7% | 38.6% | 38.7% | 38.6% | 38.7% | 38.6% | 38.6% | 38.6% | 38.7% |
| | CONVENTIONAL HIGH-SPEED TYPE | 293.1% | 293.1% | 293.0% | 293.2% | 292.9% | 293.3% | 292.8% | 293.1% | 293.1% | 293.1% | 293.0% |
| AREA | LOW LEAK TYPE | 111.6% | 104.3% | 111.6% | 104.3% | 111.6% | 104.3% | 111.6% | 111.6% | 111.6% | 104.3% | 111.6% |
| | HIGH-SPEED TYPE | 96.6% | 91.3% | 96.6% | 91.3% | 96.6% | 91.3% | 96.6% | 96.6% | 96.6% | 91.3% | 96.6% |
| | LOW LEAK/ HIGH-SPEED TYPE | 108.2% | 95.6% | 108.2% | 95.6% | 108.2% | 95.6% | 108.2% | 108.2% | 108.2% | 95.6% | 108.2% |
| | CONVENTIONAL LOW LEAK TYPE | 115.9% | 115.9% | 115.9% | 115.9% | 115.9% | 115.9% | 115.9% | 115.9% | 115.9% | 115.9% | 115.9% |
| | CONVENTIONAL HIGH-SPEED TYPE | 87.9% | 87.9% | 87.9% | 87.9% | 87.9% | 87.9% | 87.9% | 87.9% | 87.9% | 87.9% | 87.9% |

FIG.13

| | CONVENTIONAL (IlkpO = IlknO) | | | P SIDE = N SIDE ADJUSTMENT | | | TRANSISTOR WIDTH ADJUSTMENT | | |
|---|---|---|---|---|---|---|---|---|---|
| | IlkpO | IknO | | IkpO | IlknO | | IlkpO | IknO | |
| DEV. | 30.0 | 30.0 | Total | 14.1 | 30.0 | Total | 22.1 | 46.9 | Total |
| 0% | 34.3 | 16.1 | 50.4 | 16.1 | 16.1 | 32.3 | 25.2 | 25.2 | 50.4 |
| 10% | 37.7 | 16.1 | 53.8 | 17.7 | 16.1 | 33.9 | 27.7 | 25.2 | 52.9 |
| 20% | 41.1 | 16.1 | 57.3 | 19.4 | 16.1 | 35.5 | 30.2 | 25.2 | 55.5 |
| 30% | 44.6 | 16.1 | 60.7 | 21.0 | 16.1 | 37.1 | 32.8 | 25.2 | 58.0 |
| 40% | 48.0 | 16.1 | 64.1 | 22.6 | 16.1 | 38.7 | 35.3 | 25.2 | 60.5 |
| 50% | 51.4 | 16.1 | 67.6 | 24.2 | 16.1 | 40.3 | 37.8 | 25.2 | 63.0 |
| | 150% | 100% | 134% | 150% | 100% | 125% | 150% | 100% | 125% |

```
                    START
                      ↓
        ┌──────────────────────────────┐  ─── T1
        │ CONSTRUCT LOGIC CELL WITH P/N CHANNEL │
        │ MOS TRANSISTORS HAVING EQUAL LEAK CURRENTS │
        └──────────────────────────────┘
                      ↓
        ┌──────────────────────────────┐  ─── T2
        │ DETERMINE RELATIONAL EXPRESSION │
        │ OF LEAK CURRENT PER UNIT WIDTH │
        └──────────────────────────────┘
                      ↓
        ┌──────────────────────────────┐  ─── T3
        │ ADJUST LEAK CURRENT PER UNIT WIDTH │
        └──────────────────────────────┘
                      ↓
        ┌──────────────────────────────┐  ─── T4
        │ ADJUST TRANSISTOR WIDTH │
        └──────────────────────────────┘
                      ↓
                    END
```

FIG.16  RELATED ART

| | | LOW LEAK TYPE MOS TRANSISTOR | | STANDARD TYPE MOS TRANSISTOR | | HIGH-SPEED TYPE MOS TRANSISTOR | |
|---|---|---|---|---|---|---|---|
| | | P-CHANNEL | N-CHANNEL | P-CHANNEL | N-CHANNEL | P-CHANNEL | N-CHANNEL |
| UNIT LEAK CURRENT | nA/$\mu$m | 10 | 10 | 30 | 30 | 100 | 100 |
| UNIT ON CURRENT | $\mu$A/$\mu$m | 300 | 700 | 350 | 800 | 400 | 900 |
| UNIT GATE CAPACITANCE | fF/$\mu$m | 1.0 | 1.0 | 1.0 | 1.0 | 1.0 | 1.0 |
| UNIT JUNCTION CAPACITANCE | fF/$\mu$m | 1.0 | 1.0 | 1.0 | 1.0 | 1.0 | 1.0 |

# LOGIC CELL CONFIGURATION PROCESSING METHOD AND PROGRAM

CROSS REFERENCE TO RELATED APPLICATIONS

This application is a continuation of International Application No. PCT/JP2005/20071, filed on Nov. 1, 2005, now pending, herein incorporated by reference.

TECHNICAL FIELD

The present invention relates to a logic cell configuration processing method and a program thereof for a CMOS semiconductor device having a P-channel MOS transistor and an N-channel MOS transistor, and more particularly relates to reducing leak current and increasing speed.

BACKGROUND ART

As the ON voltage of transistors decreases and elements become increasingly smaller, it is becoming more difficult to ignore the leak current of semiconductor devices, including gate arrays, since leak current causes a malfunction of the logic circuit and a read error of the storage element. Leak current also wastes the batteries of built-in equipment and decreases operation time due to the flow of unnecessary current.

In the design of such a logic cell, the configuration is determined so that the leak currents of P-channel and N-channel MOS transistors are equal values per unit width.

Figure 16:
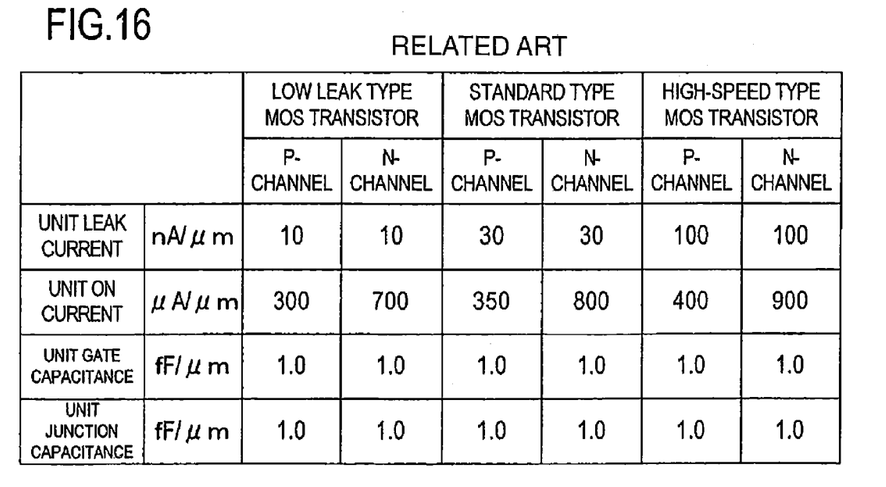
FIG. 16 is a table showing the specifications of the standard type, low leak type and high-speed MOS transistors.

FIG. 16 is a table showing an example of the specifications of a standard type, low leak type and high-speed type MOS (Metal Oxide Semiconductor) transistors. The table shows the leak current, ON current, gate capacity for performance evaluation and junction capacitance per unit transistor width. These values are listed for the P-channel and N-channel of the standard type, low leak type and high-speed type MOS transistors respectively. The junction capacitance and gate capacitance are maintained at a constant level regardless the differences of these transistors.

The standard type MOS transistor shown in FIG. 16 is a transistor which is commonly used, and is the most frequently used transistor. The leak current of the standard type MOS transistor per unit width is 30 nA/μm for both the P-channel and N-channel, and the ON current per unit width is 350 and 800 μA/μm respectively. Whereas the low leak type MOS transistor is a transistor of which leak current per unit transistor width is suppressed (10 nA/μm), although the ON current per unit transistor width is suppressed (300 and 700 μA/μm). The high-speed type MOS transistor is a transistor of which ON current per unit transistor width is increased (400 and 900 μA/μm), although an increase of the leak current per unit transistor width is allowed (100 nA/μm).

For example, in order to save power of a semiconductor device, P-channel and N-channel MOS transistors in a logic cell are both changed from a standard type MOS transistor to a low leak type MOS transistor in the design stage. In other words, to construct a low leak type cell, a standard cell is constructed using standard type MOS transistors first, then design values are replaced with those of a low leak type P-channel and low leak type N-channel MOS transistors within a range where the drop in speed of the entire LSI is allowed, while maintaining the same transistor sizes.

In order to increase the speed of a semiconductor device, P-channel and N-channel transistors in the logic cell are both changed from standard MOS transistors to high-speed type MOS transistors in the design stage. In other words, to construct a high-speed type cell, standard cells are constructed using standard type MOS transistors first, then the design values are replaced with those of a high-speed type P channel and high-speed type N channel MOS transistors within a range where the leak power of the entire LSI is allowed, while maintaining the same transistor sizes.

The replacement of the design values, from the standard type to the low leak type MOS transistors, or from the standard type to the high-speed type MOS transistors, can be performed by changing the threshold voltage of the transistor. In an actual circuit, the threshold voltage can be controlled by adjusting the impurity implantation concentration. Patent Document 1 discloses a technology to control the threshold voltage of the MOS transistor by impurity concentration.

In a conventional logic cell construction method, the same type MOS transistors are used for P-channel and N-channel MOS transistors in a cell, regardless whether the input signal is high (hereafter H) or low (hereafter L). In other words, if the P-channel MOS transistor is a standard type, the N-channel MOS transistor is also a standard type, and if the P-channel MOS transistor is a high-speed type, the N-channel MOS transistor is also a high-speed type.

In a conventional low leak type cell, both P-channel and N-channel MOS transistors are low leak type MOS transistors, so leak current is low regardless whether the input signal is H or L. On the other hand, the ON current for driving the transistors in the next stage of the low leak type P-channel and N-channel MOS transistors is lower than the standard type, so the operation speed of the circuit is slow, regardless whether the input signal is H or L. Therefore in a conventional low leak type cell, leak current is suppressed by sacrificing speed.

In the case of a conventional high-speed type cell, both P-channel and N-channel MOS transistors are high-speed type MOS transistors, so operation is high-speed, regardless whether the input signal is H or L. On the other hand, the leak current of the high-speed type P-channel and N-channel MOS transistors is higher than the standard type, so the leak current is high, regardless whether the input signal is H or L. Therefore in a conventional high-speed type cell, the operation speed is increased by sacrificing the suppression of the leak current.

And generally speaking, when a logic circuit is designed, the leak currents per unit transistor width of P-channel and N-channel MOS transistors are set to equal values, as shown in FIG. 16. The leak current of the standard type MOS transistor is 30 nA/μm per unit transistor width for both the P-channel and N-channel. The leak current of the low leak type MOS transistor is 10 nA/μm for both [P- and N-channels]. The leak current of the high-speed type MOS transistor is 100 nA/μm for both [P- and N-channels].

A new demand is now emerging, however, to design a high-speed cell with low leaking by compositely applying low leak type, high-speed type and standard type MOS transistors for a P-channel and N-channel. But it is difficult to decide how to combine these different types of transistors, since the leak current, when different types of transistors are combined, cannot be easily estimated.

Also the mobility of a P-channel is low, so the transistor width of the P-channel is designed to be larger than the N-channel. Hence in the leak current of an entire LSI, leaking from a P-channel MOS transistor is greater if it is assumed that the switching probability is equal for the P-channel and N-channel MOS transistors. In other words, in terms of the manufacturing dispersion of P-channel and N-channel MOS transistors, the dispersion of P-channel MOS transistors has a greater influence on the leak current of an entire chip. As a result, chips which do not satisfy the product specifications are manufactured, and many defective products are produced.

SUMMARY OF THE INVENTION

With the foregoing in view, it is an object of the present invention to provide a configuration processing method for a logic cell where different types of transistors are combined by estimating the leak current.

It is another object of the present invention to provide a configuration processing method for a low leak type cell of which speed is faster than a conventional low leak type cell, and a high-speed type cell of which leak is lower than a conventional standard high-speed type cell by estimating a leak current and constructing a logic cell where different types of transistors are combined.

It is still another object of the present invention to provide a configuration processing method for a logic cell whereby the influence of the dispersion of P-channel and N-channel MOS transistors on leak current in an entire LSI is equalized in the LSI development stage, the production of chips which do not satisfy the product specifications is suppressed, and the defective generation rate is decreased, by estimating a leak current and constructing a logic cell where different types of transistors are combined.

To solve the above problems, a first aspect of the present invention is a logic cell configuration processing method for a CMOS semiconductor in which leak current per unit width is equal for a P-channel MOS transistor and N-channel MOS transistors, the method having: a step of calculating a probable average leak current, which is an expected value of leak current of the P-channel MOS transistor and N-channel MOS transistor in the logic cell based on an input signal to be input to the logic cell; a step of comparing a contribution of the P-channel MOS transistor with a contribution of the N-channel MOS transistor to the calculated probable average leak current; a decision step of deciding the P-channel MOS transistor or the N-channel MOS transistor, whichever has a greater contribution, to be a low leak type MOS transistor; and an adjustment step of adjusting the ON current of the low leak type MOS transistor to be equal to ON current of the other MOS transistor.

In the first aspect of the present invention, it is preferable that an MOS transistor which has a smaller contribution is decided to be a high-speed type MOS transistor in the decision step, and the ON current of the low leak type MOS transistor is adjusted to be equal to that of the other MOS transistor in the adjustment step.

In the first aspect of the present invention, it is also preferable that an MOS transistor which has a greater contribution is decided to be a low leak type MOS transistor, and an MOS transistor which has a smaller contribution is decided to be a high-speed type MOS transistor in the decision step, and the ON currents of the leak type MOS transistor and of the high-speed type MOS transistor are adjusted to be equal to each other in the adjustment step.

In the first aspect of the present invention, it is also preferable that the adjustment to be made so that the ON currents become equal is performed by adjusting a transistor width.

In the first aspect of the present invention, it is also preferable that the adjustment to be made so that the ON currents become equal is performed by adjusting an impurity implantation concentration.

In the first aspect of the present invention, it is also preferable that the adjustment to be made so that the ON currents become equal is performed by a substrate bias circuit.

In the first aspect of the present invention, it is also preferable that the probable average leak current is a value determined by multiplying a transistor width, leak current per unit width, and a coefficient which indicates leak currents from a plurality of MOS transistors based on the leak current when a predetermined voltage is applied to an MOS transistor having a unit width and dividing the product by a total number of patterns of input signals to be input to the logic cell, for a P-channel MOS transistor and an N-channel MOS transistor, and adding the respective result values.

A second aspect of the present invention is a logic cell configuration processing method for a CMOS semiconductor which has a P-channel MOS transistor and an N-channel MOS transistor, the method having: a step of adjusting leak current of the P-channel MOS transistor and the N-channel MOS transistor per unit width so that a contribution of the P-channel MOS transistor and a contribution of the N-channel MOS transistor become equal in expressions to determine probable average leak currents, which are expected values of leak current of the P-channel MOS transistor and the N-channel MOS transistor in the logic cell based on an input signal to be input to the logic cell; and a step of adjusting the transistor width of the P-channel MOS transistor and the N-channel MOS transistor to obtain a desired ON current.

In the second aspect, it is preferable that the probable average leak current is a value determined by multiplying a transistor width, leak current per unit width, and a coefficient which indicates leak currents from a plurality of MOS transistors based on the leak current when a predetermined voltage is applied to an MOS transistor having a unit width and dividing the product by a total number of patterns of input signals to be input to the logic cell, for a P-channel MOS transistor and an N-channel MOS transistor, and adding the respective result values.

In the second aspect, it is preferable that the logic cell is a majority logic cell in an LSI.

PREFERRED EMBODIMENTS OF THE INVENTION

Embodiments of the present invention will now be described with reference to the drawings. The technical scope of the present invention, however, shall not be limited to these embodiment, but extend to matters stated in the Claims and equivalents thereof.

Figure 1:
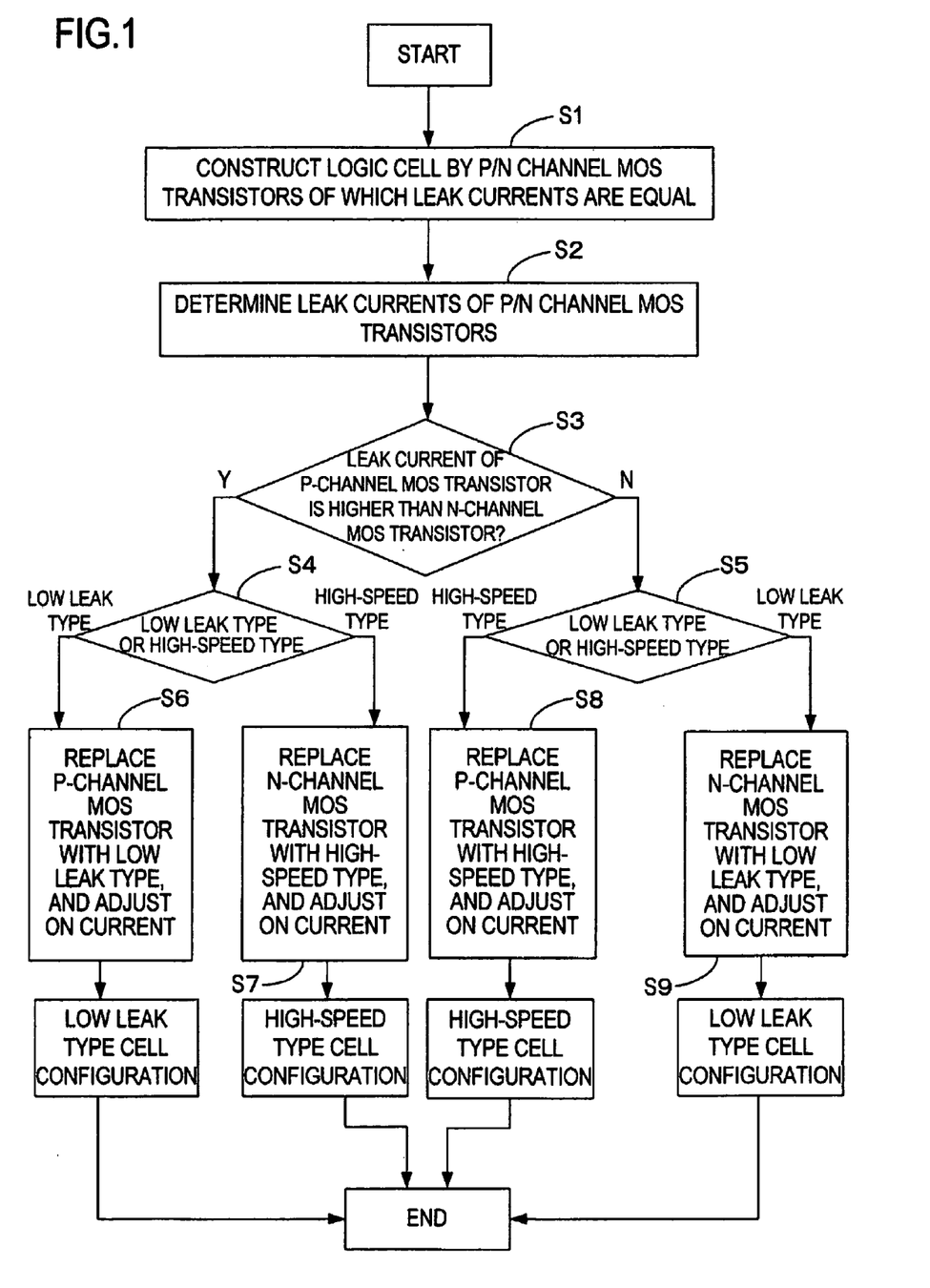
FIG. 1 is a flow chart depicting a logic cell configuration processing method according to the present invention.
Figure 2:
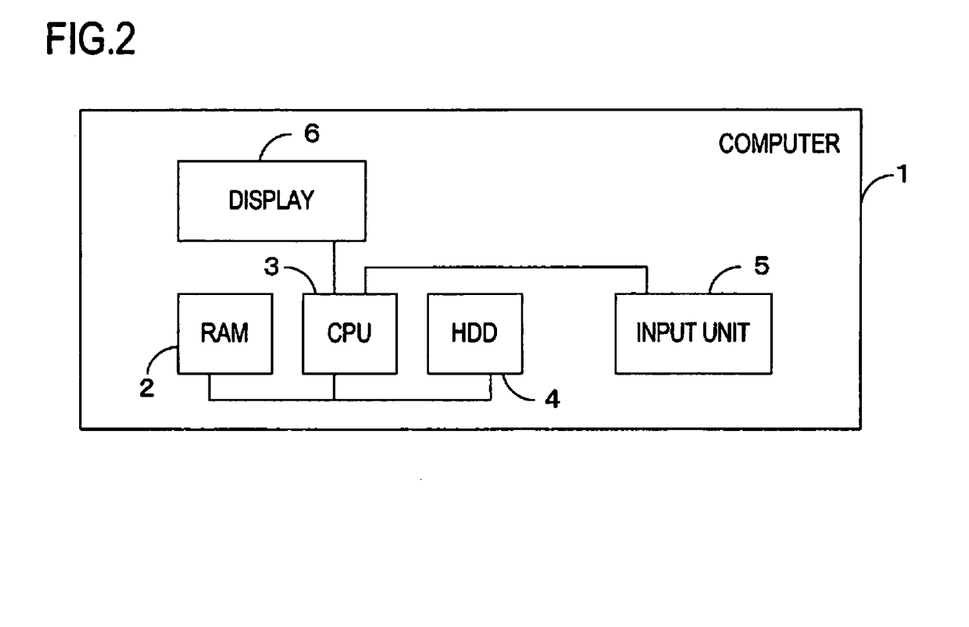
FIG. 2 is a diagram depicting a configuration of a computer where a program which executes a procedure in the flow chart in FIG. 1 runs.

FIG. 1 is a flow chart depicting a logic cell configuration processing method according to a first embodiment of the present invention. FIG. 2 shows a configuration of a computer where a program which executes the procedure of the flow chart in FIG. 1 runs. As FIG. 2 shows, the computer 1 is comprised of a random access memory (hereafter RAM) 2, central processing unit (CPU) 3, hard disk drive (hereafter HDD) 4, input unit 5 and display 6.

The program for executing the procedure in FIG. 1 is stored on the HDD 4, and is developed in the RAM 2 when executed. The developed program is executed by the CPU 3. Data to be used by the program is input via the input unit 5, which is comprised of a keyboard and mouse, and the input is confirmed by being displayed on the display 6.

When the program is started, a standard logic cell is constructed using P-channel and N-channel MOS transistors (step S1). A standard logic cell is a logic cell where both P-channel and N-channel MOS transistors are standard type MOS transistors. In this step, data of the standard logic cell is acquired from the HDD 4.

Then considering H/L of the input signal and the output signal which is the result, leak currents by P-channel and N-channel MOS transistors are determined (step S2). Based on the leak currents determined in step S2, it is judged which one, P channel MOS transistor or N-channel MOS transistor, generates more leak current (step S3).

If it is judged that the leak current by the P-channel MOS transistor is higher in step S3, constructing either a low leak type cell or a high-speed type cell is selected (step S4). If a low leak type cell is constructed, the design value of a P-channel MOS transistor in the logic cell is replaced with a low leak type P-channel MOS transistor, and adjustment is made so that the ON current becomes the same as before replacement (step S6). In this way, the low leak type cell is constructed, and processing ends. If constructing a high-speed type cell is selected in step S4, the design value of the N-channel MOS transistor in the logic cell is replaced with a high-speed type N channel MOS transistor, and adjustment is made so that the ON current becomes the same as before replacement (step S7). In this way, a high-speed type cell is constructed, and processing ends.

If it is judged that the leak current by a P-channel MOS transistor in the logic cell is lower than the leak current by an N-channel MOS transistor in step S3, constructing either a low leak type cell or a high-speed type cell is selected (step S5). If a high-speed type cell is constructed, the design value of the P-channel MOS transistor in the logic cell is replaced with a high-speed type P channel MOS transistor, and adjustment is made so that the ON current becomes the same as before replacement (step S8). In this way, a high-speed type cell is constructed, and processing ends. If a low leak type cell is constructed, the design value of the N-channel MOS transistor in the logic cell is replaced with a low leak type N channel MOS transistor, and adjustment is made so that the ON current becomes the same as before replacement (step S9). In this way, a low leak type cell is constructed, and processing ends.

The procedure of the flow chart in FIG. 1 will now be described concretely.

Figure 3:
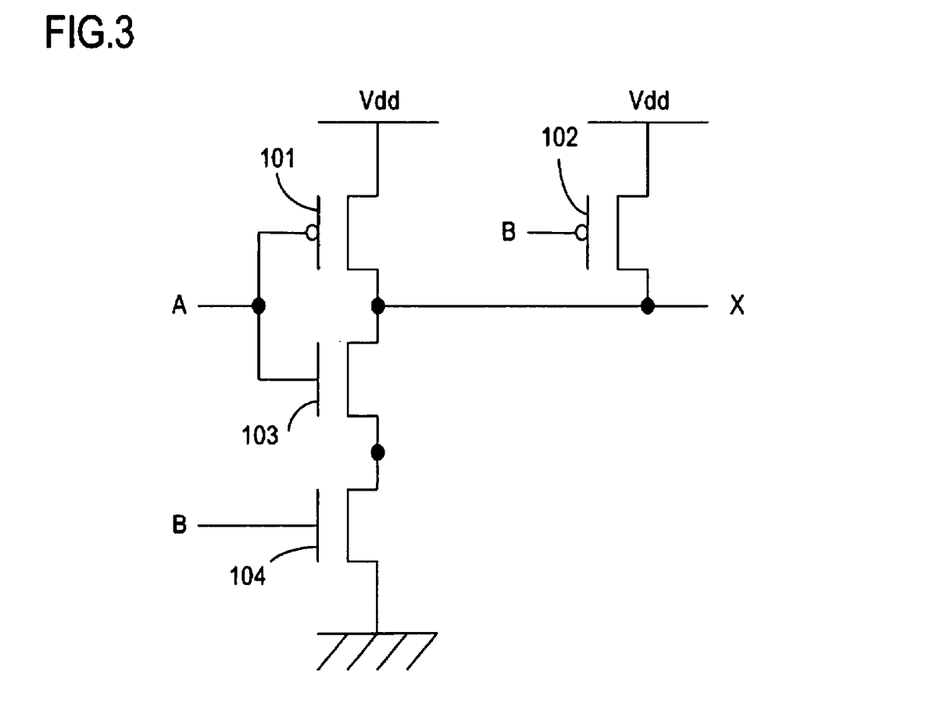
FIG. 3 is a diagram depicting a configuration of a two-input NAND which is used for describing the present embodiment.

FIG. 3 is a diagram depicting a configuration of a two-input NAND used for describing the present embodiment. A source of the P-channel MOS transistor 101 and a drain of the N-channel MOS transistor 103 are connected, and a same input A is input to the gates of both [P- and N-channel MOS transistors]. A drain of an N-channel MOS transistor 104 is connected to a source of the N-channel MOS transistor 103, and a source of the N channel MOS transistor 104 is grounded. A source of a P-channel MOS transistor 102 is connected to a node between the P-channel MOS transistor 101 and the N-channel MOS transistor 103, and this node becomes output X of the two NAND gate. A same input B is input to gates of the P-channel MOS transistor 102 and the N-channel MOS transistor 104. Vdd is connected to drains of the P-channel MOS transistors 101 and 102.

Figure 10:
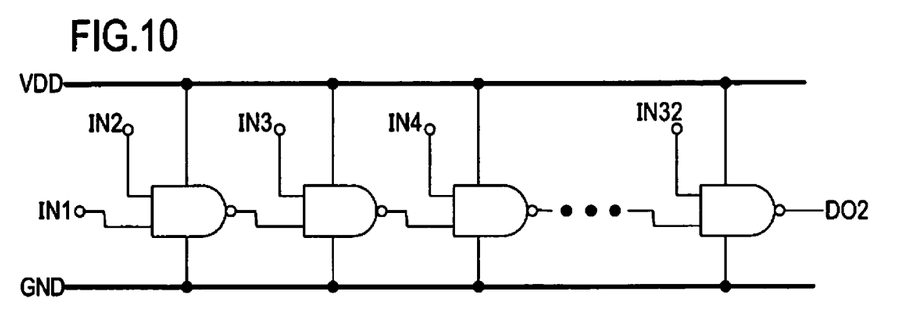
FIG. 10 is a diagram depicting a 31-stage cascade circuit comprised only of a two-input NAND.

The present invention is effective to construct a gate array, as shown in FIG. 10, where logic cells, such as the two-input NAND in FIG. 3, are connected in many stages.

In a general logic cell, an occurrence probability of H/L of the output signal depending on a combination of input signals, such as input A and input B in FIG. 3, is predetermined. A leak current, which flows depending on a combination pattern of the input signals, is also predetermined. For example, in the case of the inputs A and B in FIG. 3, combination patterns (H, H), (L, L), (H, L) and (L, H) exist, and leak current is determined for each pattern.

It is assumed that when the total number of combinations of the input patterns is N, the leak current which flows when the i-th combination is used is Ilk_i. The occurrence probability of each input pattern is 1/N, and the probable average leak current Ileak, when the leak currents that flow are added for all input patterns is $$Ileak = \left(\sum_{i=1}^{N} Ilk\_i\right) / N \ldots \quad (1)$$

Figure 4:
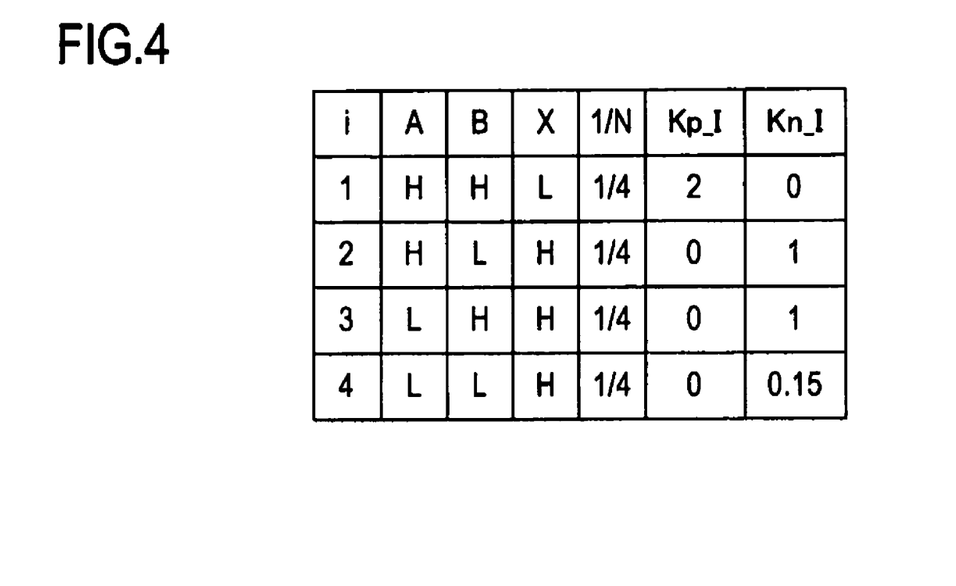
FIG. 4 is a truth table of the two-input NAND.

FIG. 4 is a truth table of a two-input NAND. In the case of a two-input NAND, the total number N of combinations of inputs A and B is 4, so the occurrence probability of respective pattern 1/N is ¼, X is an output of the two-input NAND in a respective combination pattern. Kp_I and Kn_I will be described later.

Here it is assumed that the leak current flowing through the P-channel MOS transistor is Ilkp, and the leak current flowing through the N-channel MOS transistor is Ilkn. When ON current flows through either a P-channel or N-channel MOS transistor in the logic cell, leak current flows from the other, so Ilkn and Ilkp never flow together simultaneously. Therefore Ilk_i can be divided into a case of flowing through the P-channel MOS transistor, and the case of flowing through the N-channel MOS transistor, depending on the combination pattern of the input signals.

Also Ilkp and Ilkn depend on such conditions as the number of transistors which leak current flows through and the voltage applied to both ends of the transistors in each combination of input signals. Hence the coefficient which represent Ilkp or Ilkn must be defined for each combination of input signals.

In P-channel and N-channel MOS transistors, the values of leak currents, when voltage Vdd is applied to one end of an MOS transistor in the unit width and the other is grounded, are defined as Ilkp0 and Ilkn0. The transistor widths of P-channel and N-channel MOS transistors are defined as Wp and Wn respectively. Coefficients to indicate the number of MOS transistors which generate leak current according to the voltage conditions to be applied to the respective MOS transistors, based on Ilkp0 and Ilkn0 as reference, are defined as Kp and Kn.

Expression (1) of the probable average leak current can be expressed using N, Kp, Kn, Ilkp0, Ilkn0, Wp and Wn, that is $$Ileak = \frac{Kp}{N} \cdot Ilkp0 \cdot Wp + \frac{Kn}{N} \cdot Ilkn0 \cdot Wn \ldots \quad (2)$$

This indicates an expected value of the probable distribution of the leak current when a sufficient number of logic gates exist, and input signals are decided completely at random.

Using Kp and Kn and Wp and Wn, it is determined which one of the conventional standard type P-channel MOS transistor or N-channel MOS transistor is replaced with a low leak type or high-speed type MOS transistor.

Figure 5:
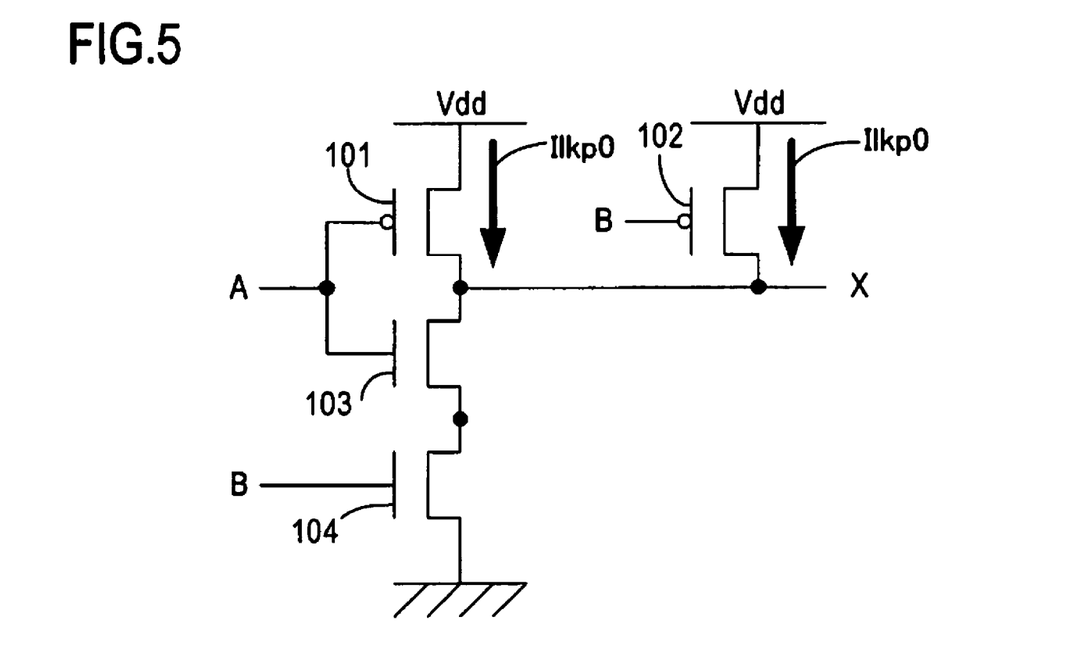
FIG. 5 is a diagram depicting a case when H is input to the two inputs of the two-input NAND in FIG. 3.
Figure 6:
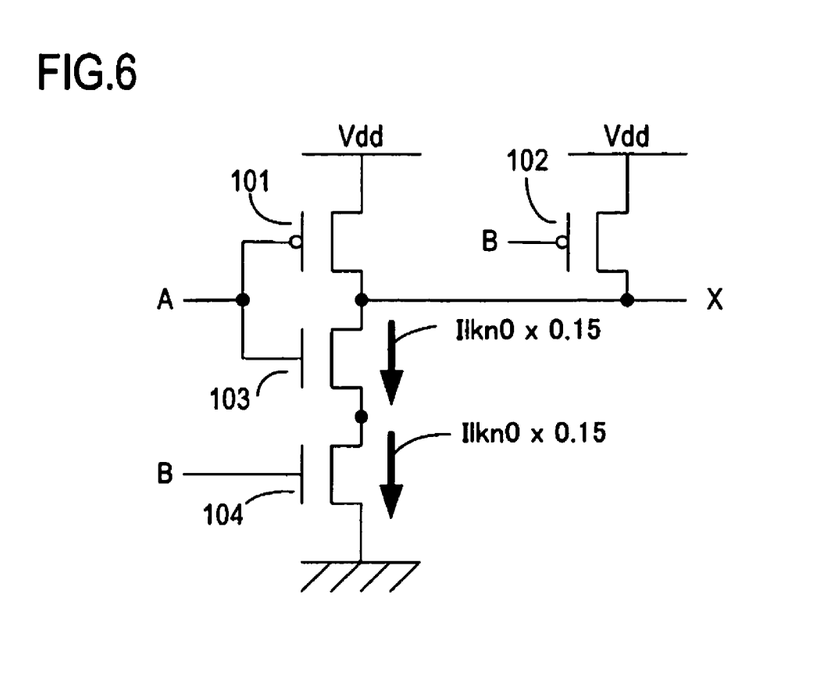
FIG. 6 is a diagram depicting a case when L is input to the two inputs of the two-input NAND in FIG. 3.

FIG. 5 is a diagram depicting the case when H is input to the two inputs A and B of the two-input NAND in FIG. 3. FIG. 6 is a diagram depicting the case when L is input to the two inputs A and B of the two-input NAND in FIG. 3. FIG. 5 is the two-input NAND when the input signal state is i=1, and FIG. 6 is the two-input NAND when the input signal state is i=4, according to the truth table in FIG. 4.

If inputs A and B are both H, the leak currents are generated from the P-channel MOS transistors 101 and 102, as shown in FIG. 5, and flow to the ground via the N-channel MOS transistors 103 and 104 in ON status. If H is input to one of the inputs A and B, and L is input to the other, the node of the output X becomes H, so leak current is generated from either the N-channel MOS transistor 103 or 104 in OFF status, and flows to the ground. If both the inputs A and B are L, the node of the output X becomes H, leak current is generated from the N-channel MOS transistors 103 and 104 which are in OFF state, and flows to the ground, as shown in FIG. 6.

Kp_I and Kn_I in the truth table in FIG. 4 show the values of the leak current, based on a reference that is the leak current from one transistor in the unit width when the voltage Vdd is applied between a source and a drain. In the case of i=1, leak currents are generated from the P-channel MOS transistors 101 and 102 in parallel, on which the voltage Vdd is being applied, respectively, so Kp_I=2. In the case of i=2, 3, a gate of either the P-channel MOS transistor 101 or 102 turns ON, and the node of the output X becomes H, so the voltage Vdd is applied to the N-channel MOS transistor 103 or 104, which is in OFF state, and leak current for the amount generated by one N-channel MOS transistor is generated. In the case of input pattern i=4, both N-channel MOS transistors 103 and 104, vertically stacked in two stages, become OFF, voltage is divided, and the voltage of Vdd/2 is applied per stage. As a result, because of the relaxation of DIBL (Drain Induced Barrier Lowering), the leak current value becomes much smaller than half of that when the voltage Vdd is applied. Here it is assumed that this value is 15% of that when the voltage Vdd is applied for calculation. In this way, in the case of a two-input NAND cell, Kp and Kn, which are the total values of Kp_I and Kn_I in each input pattern, are decided as Kp=2.0 and Kn=2.2 respectively.

Kp·Wp and Kn·Wn in Expression (2) are compared, and if Kp·Wp is greater, the design value of the P-channel MOS transistor in the cell is replaced with the low leak type MOS transistor, and if Kn·Wn is greater, the design value of the N-channel MOS transistor in the cell is replaced with the low leak type MOS transistor.

Figure 9:
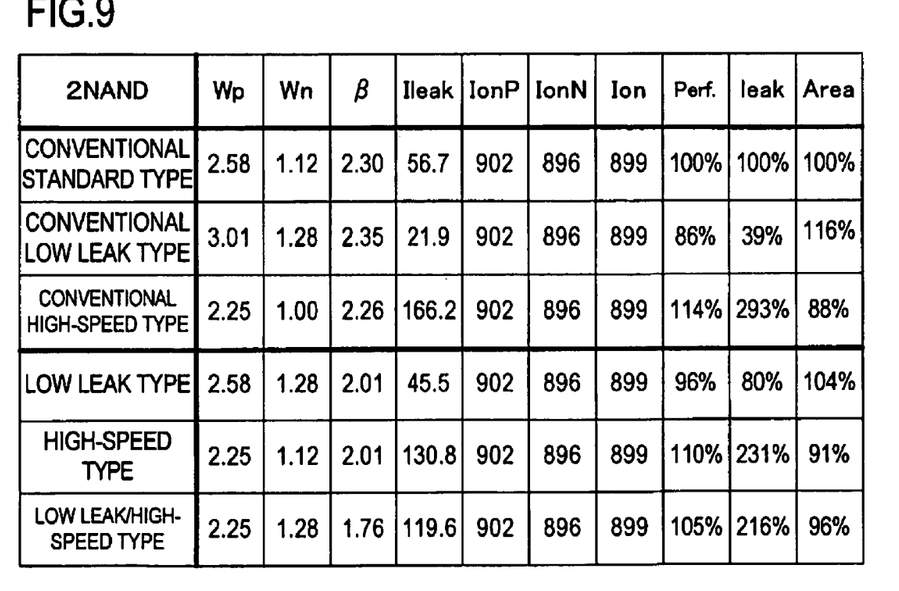
FIG. 9 is a table showing the evaluation result of each cell.

FIG. 9 is a table showing the evaluation result of each cell. The top [three] columns in FIG. 9 show the evaluation results of the two-input NAND cell constructed according to the conventional method. And the bottom [three] columns in FIG. 9 show the evaluation results of the two-input NAND cell constructed according to the present invention.

In FIG. 9, Wp and Wn are the transistor widths of the P-channel and N-channel MOS transistors respectively. β is a ratio of Wp/Wn. Ileak is a probable average leak current. IonP and IonN are the ON currents of the P-channel and N-channel MOS transistors respectively, and Ion is an average value thereof. Perf, leak and Area are the operation speeds, leak current and area of the cell, which are evaluated based on the conventional standard type.

If the values in FIG. 9 are used, in the case of the conventional standard two-input NAND, Kp·Wp=2.0·2.58=5.16, and Kn·Wn=2.2·1.12=2.46. In this case, Kp·Wp is greater, so the design value of the P-channel MOS transistor is replaced with the low leak type P-channel MOS transistor, whereby the low leak type cell of the present invention is constructed. For the replaced P-channel MOS transistor, the design value of the transistor width is adjusted so as to maintain the ON current. If the design value of the standard type MOS transistor is replaced with the low leak type, the ON current decreases, therefore the transistor width is adjusted so as to be wider. If the ON current per unit width of the standard type MOS transistor per unit width is stIon and the ON current per unit width of the low leak type MOS transistor per unit width is lllon, the transistor width after replacement is adjusted so as to be stIon/lllon times of the original transistor width.

Now a case of replacing the design value of either the P-channel or N-channel MOS transistor with a high-speed type MOS transistor will be described. Kp·Wp and Kn·Wn are compared in Expression (2) to determine the probable average leak current, and if Kp·Wp is smaller, the design value of the P-channel MOS transistor in the cell is replaced with a high-speed type MOS transistor, or if Kn·Wn is smaller, the design value of the N-channel MOS transistor in the cell is replaced with a high-speed type MOS transistor.

If the values of the conventional standard type two-input NAND cell in the table in FIG. 9 are used, Kp·Wp=2.0·2.58=5.16, and Kn·Wn=2.2·1.12=2.46. In this case, Kn·Wn is smaller, so the design value of the N-channel MOS transistor is replaced with a high-speed type N-channel MOS transistor. For the replaced N-channel MOS transistor, the design value of the transistor width is adjusted so as to maintain the ON current before replacement. If the design value of the standard type MOS transistor is replaced with a high-speed type, the ON current increases, therefore the transistor width is adjusted to be narrower. If the ON current per unit width of the standard type MOS transistor is stIon, and the ON current per unit width of the high-speed type MOS transistor is hpIon, the transistor width after replacement is adjusted so as to be stIon/hpIon times the original transistor width.

Now a case of replacing the design value of either the P-channel or N-channel MOS transistor with a low leak type MOS transistor, and replacing the design value of the other thereof with a high-speed MOS transistor, will be described. Kp·Wp and Kn·Wn are compared in Expression (2) to determine the probable average leak current, and if Kp·Wp is greater, the design value of the P-channel MOS transistor in the cell is replaced with a low leak type MOS transistor, and at the same time, the design value of the N-channel MOS transistor is replaced with a high-speed type MOS transistor. If Kn·Wn is greater, the design value of the N-channel MOS transistor in the cell is replaced with the low leak type MOS transistor, and at the same time, the design value of the P-channel MOS transistor is replaced with a high-speed type MOS transistor.

For the replaced MOS transistor, the design value of the transistor width is adjusted so as to maintain the ON current. If the ON current per unit width of the standard MOS transistor is stIon, and the ON current per unit width of the low leak type MOS transistor is llIon, and the ON current per unit width of the high-speed type MOS transistor is hpIon, the transistor width after being replaced with the low leak type MOS transistor is adjusted so as to be stIon/llIon times [of the original transistor width], and the transistor width after being replaced with the high-speed type MOS transistor is adjusted so as to be stIon/hpIon times [of the original transistor width].

For the above mentioned actual replacement of MOS transistors, a low leak type MOS transistor or a high-speed type MOS transistor is required, and low leak type and high-speed type MOS transistors can be implemented by controlling the threshold voltage Vth of the MOS transistors. The available methods are a control method based on a process whereby the impurity concentration of the channel portion is changed, and a substrate bias control method whereby the threshold voltage Vth is changed by controlling the well potential. The control method based on the process whereby the impurity concentration of the channel portion is changed can be applied to the above mentioned configuration. The substrate bias control method whereby the threshold voltage Vth is changed by controlling the well potential can also be used.

Figure 7:
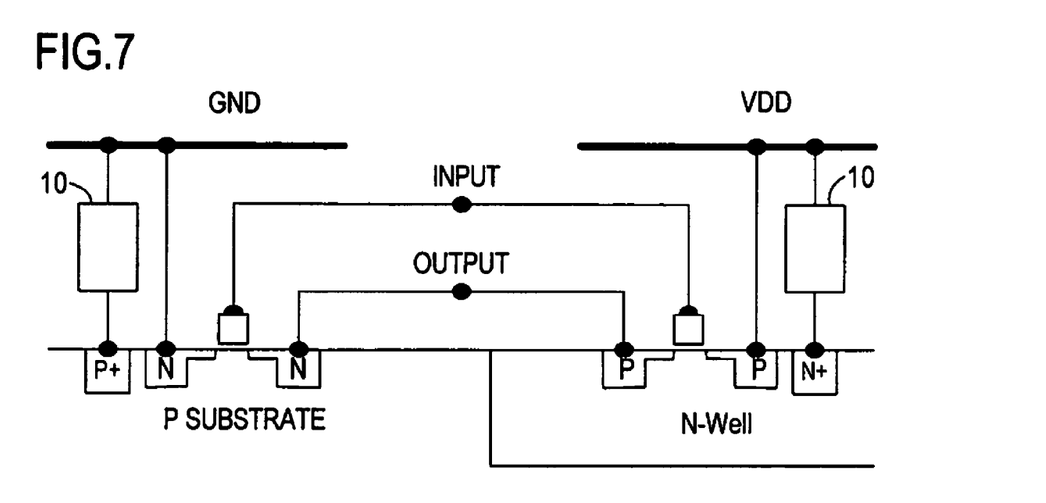
FIG. 7 is a diagram depicting a CMOS semiconductor device where a substrate bias control system is applied.

FIG. 7 is a CMOS semiconductor device to which the substrate bias control method is applied. The substrate bias circuit 10 used here controls the potential of the P-substrate, which is connected to the ground GND, and the potential of the N-well, which is connected to the power supply Vdd.

The threshold voltage Vth of the N-channel MOS transistor is controlled by controlling the potential of the P-substrate, and the threshold voltage Vth of the P-channel MOS transistor is controlled by controlling the potential of the N-well. In this way, the standard type MOS transistor is replaced with an actual low leak type MOS transistor or high-speed type MOS transistor, and the low leak type cell or high-speed type cell according to the present invention can be constructed. If the substrate bias control method is used, this can be implemented merely by circuit mounting, without changing the process.

Figure 8:
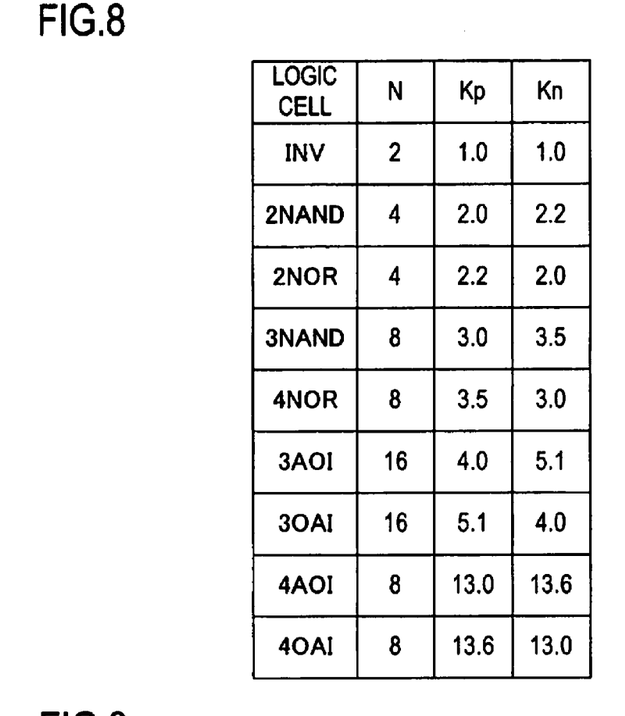
FIG. 8 is a table showing the Kp and Kn values of the logic gate for each logic type.

FIG. 8 is a table showing the values of Kp and Kn for each type of logic cell. Kp and Kn are coefficients to indicate the leak current from a plurality of MOS transistors, based on a leak current when a predetermined voltage is applied to P-channel and N-channel MOS transistors in unit widths. N is a total number of combination patterns of the input signals to be into to a cell.

In the case of the logic cell INV which inverts the input signal and outputs it, for example, the total number N of the input patterns is 2, H and L, since there is only one input. When H is input, a leak current is generated from the P-channel MOS transistor to which the voltage Vdd is applied, so Kp becomes 1.0. When L is input, a leak current is generated from the N-channel MOS transistor to which the voltage Vdd is applied, so Kn becomes 1.0.

As the values in FIG. 8 show, Kp/Kn is about 0.7~1.3 for any type of logic cell. If these values are multiplied by a general transistor width ratio Wp/Wn=2, and the ratio of (Kp·Wp)/(Kn·Wn) is 1 or more regardless the type of logic cell. This means that Kp·Wp is always greater than Kn·Wn, and indicates that a low leak type cell can be created by replacing the design value of the standard type P-channel MOS transistor with a low leak type P-channel MOS transistor, regardless the type of logic cell, and that a high-speed type cell can be created by replacing the design value of the standard type N-channel MOS transistor with a high-speed type N-channel MOS transistor regardless the type of logic cell.

FIG. 9 is a table showing the evaluation result of each cell. The top [three] columns of FIG. 9 show the evaluation results of a two-input NAND cell constructed according to the conventional method. The bottom [three] columns of FIG. 9 show the evaluation results of a two-input NAND cell constructed according to the present invention.

In FIG. 9, Wp and Wn are the transistor widths of the P-channel and N-channel MOS transistors respectively. β is a ratio of Wp/Wn. Ileak is a probable average leak current. IonP and IonN are the ON currents of the P-channel and N-channel MOS transistors respectively, and Ion is an average value thereof. Perf., leak and Area are the operation speed, leak current and area of the cell evaluated based on the conventional standard type.

The low leak type cell according to the first embodiment of the present invention can be acquired by replacing the design value of a P-channel MOS transistor of the conventional standard type cell with a low leak type MOS transistor. The high-speed type cell of the present invention can be acquired by replacing the design value of a N-channel MOS transistor of the conventional standard type cell with a high-speed type MOS transistor. The low leak/high-speed type cell of the present invention can be acquired by replacing the design value of a P-channel MOS transistor of a convention standard type cell with a low leak type MOS transistor, and the design value of an N-channel MOS transistor with a high-speed type MOS transistor.

In the case of the low leak type cell of the present invention, leak current is 20% less compared with the conventional standard type cell. Although the performance drops 4%, the performance drop of the conventional low leak type cell is 14%, so operation speed is faster than the conventional low leak type cell. In other words, the low leak type cell positions between the conventional standard type and the conventional leak type.

In the case of a high-speed type cell, the performance improves 10%, compared with a conventional standard type cell. Although the leak current becomes 231%, the leak current of a conventional high-speed type cell is 293%, so the leak current is lower than the conventional high-speed type cell. In other words, the high-speed type cell according to the present invention positions between a conventional standard type and a conventional high-speed type.

FIG. 10 is a 31-stage cascade circuit constructed only with a two-input NAND. An appropriate potential, H or L, is applied to the 32 input terminals (32 bits) of this circuit, and the leak current of the entire circuit is determined for each input pattern by simulation. When 32-bit input patterns are applied at random, and the observed leak current generation frequency is tabulated, the distribution shown in FIG. 11 is acquired.

Figure 11:
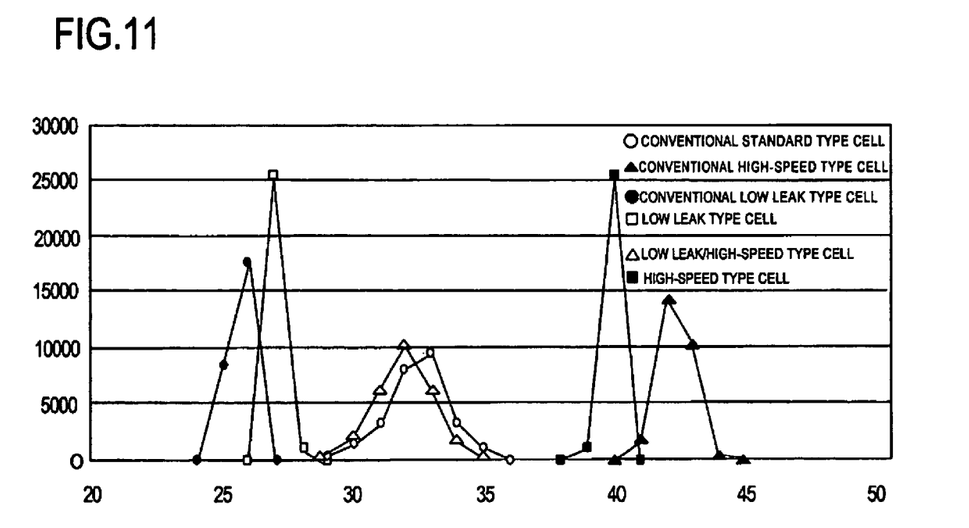
FIG. 11 is a graph depicting a leak current generation frequency when a random input is applied to the circuit in FIG. 10.

FIG. 11 is a graph depicting the leak current generation frequency when random input is applied to the circuit in FIG.

10. The abscissa of FIG. 11 indicates a leak current value, and the ordinate indicates a generation frequency. The number of input patterns used in this case is about 25,000.

In the low leak type cell according to the present invention, the distribution center positions to the higher leak current side compared to the conventional low leak type cell, but the leak is lower than the conventional standard type cell. In the high-speed type cell according to the present invention, the distribution center positions to the higher leak current side compared to the conventional standard type cell, but the leak is lower than the conventional high-speed type cell. Hence an adjustment of characteristics in a single cell unit is also effective for a large scale circuit.

Figure 12:
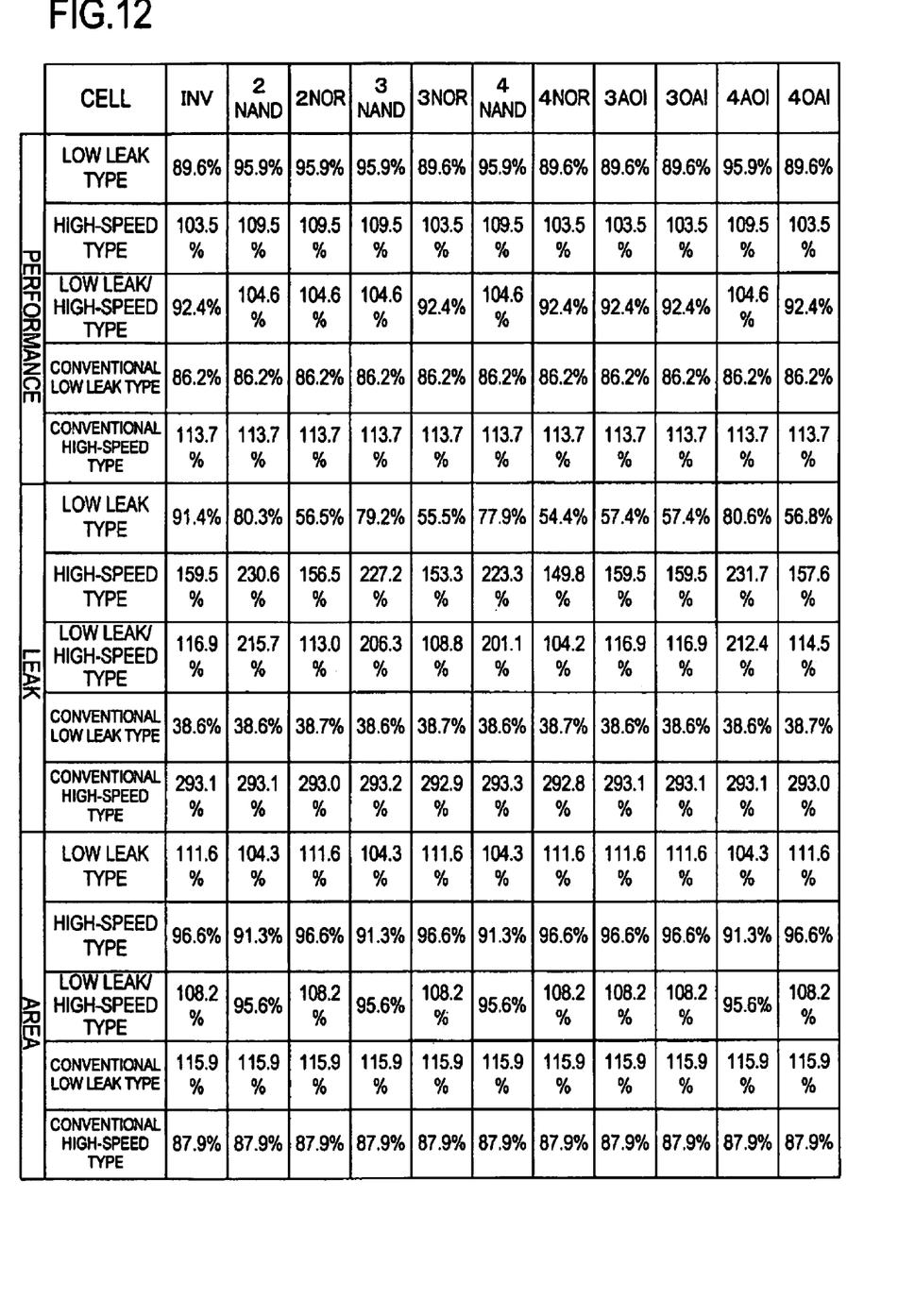
FIG. 12 is a table comparing a case when the present invention is applied to logic cells other than the two-input NAND, with a conventional type.

FIG. 12 shows a comparison chart with conventional cells when the present invention is applied to a logic cell other than a two-input NAND. This is an evaluation of the conventional low leak type, conventional high-speed type, low leak type, high-speed type, and low leak/high-speed type cells concerning performance to indicate the operation speed, leak current and cell area, when the conventional standard type cell is 100%. The logic cells used for the evaluation are not limited to a two-input NAND, but also to logic cells, such as INV, a two-input NOR, three-input NAND and three-input NOR.

In the case of a two-input NOR, the performance to indicate the operation speed of a conventional high-speed cell improves 13.7%, while that of a high-speed type cell of the present invention improves 9.5%. The performance of a convention low leak type cell drops to 86.2% of a conventional standard type cell, while the performance of a low leak type cell of the present invention drops only to 95.9% of a conventional standard type cell.

According to the comparison of the leak current in a two-input NOR in FIG. 12, the conventional high-speed type cell generates 293.0% of leak current compared to a conventional standard type cell, but the high-speed type cell of the present invention generates only 156.5% of leak current. The conventional low leek type cell generates 38.7% leak current compared to a conventional standard type cell, but the low leak type cell of the present invention generates 56.5%.

According to the comparison of the cell area in the two-input NOR in FIG. 12, a conventional high-speed type cell is 87.9% of a conventional standard type cell, but the high-speed type cell of the present invention is 96.6%. A conventional low leak type cell is 115.9% compared to a conventional standard type cell, but the low leak type cell of the present invention is 111.6%. In this way, an effect similar to a two-input NAND can be implemented even for a different type of logic cell.

Now a second embodiment of the present invention will be described.

Figure 13:
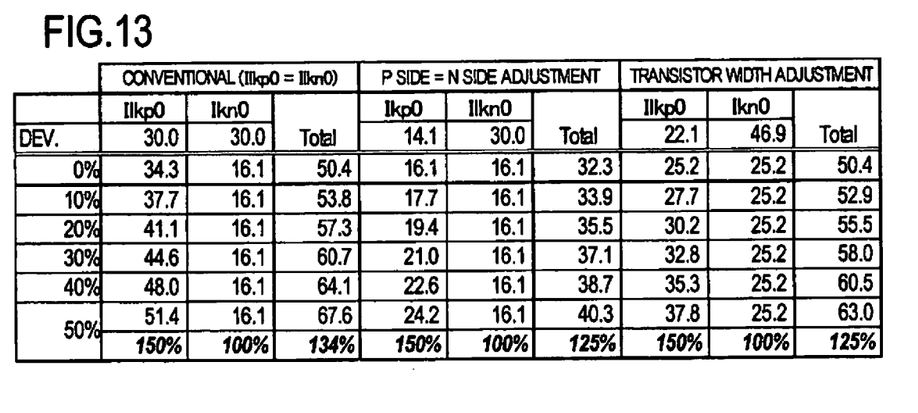
FIG. 13 is a table showing the change of the total leak amount with respect to the manufacturing dispersion of a P-channel MOS transistor.
Figure 14:
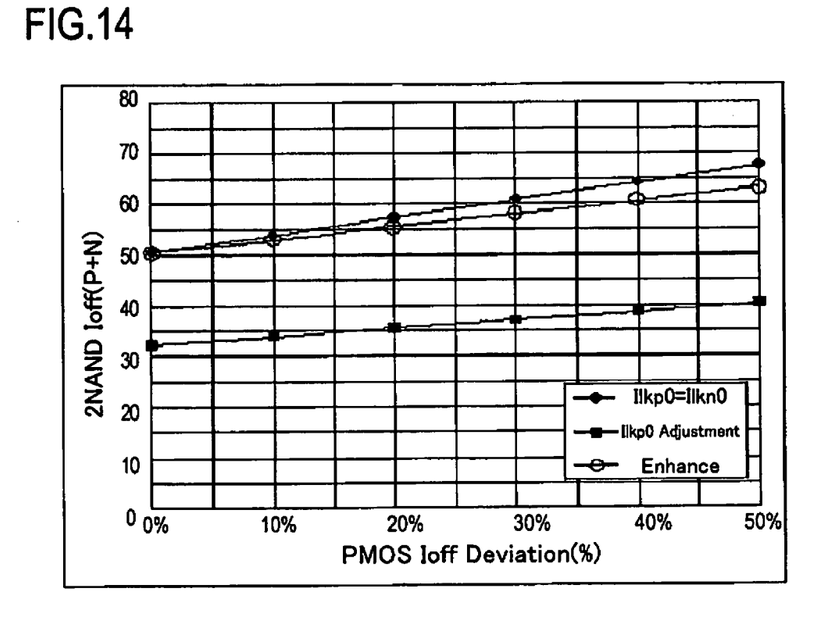
FIG. 14 is a graph created based on the numeric values in FIG. 13.

FIG. 13 is a table showing a change of the total leak amount with respect to the manufacturing dispersion of a P-channel MOS transistor. FIG. 14 is a graph created based on the numeric values in FIG. 13. The manufacturing dispersion here refers to the variation of the leak current per unit width depending on the product.

In the case of the conventional two-input NAND gate in FIG. 13, for example, the leak current per unit width of the P-channel and N-channel MOS transistors, that is Ilkp0 and Ilkn0, are adjusted to 30.0. In this case, the leak current from the P-channel MOS transistor is 34.3, and the leak current from the N-channel MOS transistor is 16.1. The total of these two leak current is 50.4.

The leak current per unit width in an actual CMOS transistor product deviates from an estimate in designing. Here the total leak currents, when the leak current Ilkp0 of the P-channel per unit width increases from 0% to 50%, is calculated.

When the dispersion of the leak current Ilkp0 of the P-channel MOS transistor per unit width is increased from 0% to 50%, the total of the leak currents increases 34% in a conventional type. Whereas, if the leak current Ilkp0 of the P-channel per unit width is adjusted so that the leak currents of the P-channel and N-channel MOS transistors become equal, the total of the leak currents increases 25% when dispersion is 50%.

The absolute value of the leak current decreases with adjustment, but the speed of a device with low leak current is generally slow, so this is recovered by adjusting the transistor width. For this, the design value of the transistor width is adjusted to secure the conventional ON current, while maintaining the leak currents of the P-channel and N-channel MOS transistors to be equal. In this case, the leak currents of the P-channel and N-channel MOS transistors per unit width are 22.1 and 46.9. The leak currents from the P-channel and N-channel MOS transistors are 25.2 respectively. In this case as well, the increase of the total of the leak currents of the P-channel MOS transistor when dispersion is 50% is still 25%.

Figure 15:
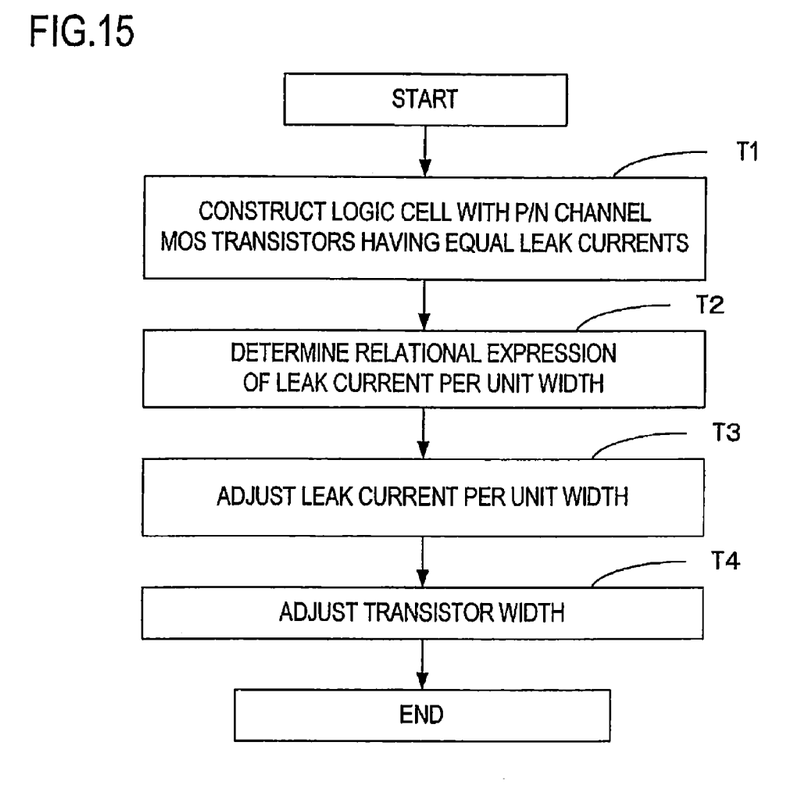
FIG. 15 is a flow chart depicting a logic cell configuration processing method according to a second embodiment of the present invention.

FIG. 15 is a flow chart depicting a logic cell configuration processing method according to a second embodiment of the present invention. FIG. 2 shows a configuration of a computer where a program which executes the procedure of the flow chart in FIG. 15 runs. Computer 1 is comprised of RAM 2, CPU 3, HDD 4, input unit 5 and display 6.

The program for executing the procedure in FIG. 15 is stored on the HDD 4, and is developed in the RAM 2 when executed. The developed program is executed by the CPU 3. Data to be used by the program is input via the input unit 5, and the input is confirmed by being displayed on the display 6.

When the program is started, data of a logic cell constructed by the conventional construction method is generated (step T1). When a representative logic gate inside the LSI is a two-input NAND, the probable average leak current of the two-input NAND is given by the following.

$$Ileak = \frac{1}{4} \cdot 2 \cdot Ilkp0 \cdot Wp + \frac{1}{4} \cdot 2.2 \cdot Ilkn0 \cdot Wn \dots \quad (3)$$

This is an expression when the values of N, Kp and Kn of the two-input NAND in FIG. 8 are substituted in Expression (2). In this expression, the contribution of the P-channel MOS transistor to the leak current is the first term of the right hand side, and the contribution of the N-channel MOS transistor to the leak current is the second term of the right hand side.

In this case, to equalize the influence of the manufacturing dispersion of the P-channel and N-channel MOS transistors, the first term and the second term in Expression (3) must be equal.

If Wp/Wn is $\beta$, that is Wp=$\beta$Wn, then the contributions of the P-channel MOS transistor and the N-channel MOS transistor to the leak currents are $2 \cdot Ilkp0 \cdot \beta \cdot Wn/4$ and $2.2 \cdot Ilkn0 \cdot Wn/4$ respectively. Generally $\beta$ can be a ratio of mobility, which is about 2. If it is assumed that $\beta=2$, the following relational expression must be satisfied to equalize the influence of the manufacturing dispersion of the P-channel and N-channel MOS transistors.

$$4 \cdot Ilkp0 = 2.2 \cdot Ilkn0 \quad (4)$$

In this way, the relational expression of the leak current per unit width is determined (step T2).

Then the design values of Ilkp0 and Ilkn0 are adjusted so as to satisfy the relationships of the acquired Expression (4) (step T3). Adjustment for an actual circuit is performed by adjusting the concentration of the impurity implantation, or by adjusting the potential by the substrate bias circuit.

Then the design values of the transistor widths are adjusted so as to acquire a desired ON current (step T4). To increase the ON current, the transistor width is increased, and to decrease the ON current, the transistor width is decreased. Now processing completes.

By this, the influence of the dispersion of the P-channel and N-channel MOS transistors on the leak current in the entire LSI can be equalized in the device development stage.

A method of providing a plurality of threshold voltages Vth of the transistors in chip design already exists, and has been widely used. The method according to the present invention provides guidelines to select a respective threshold voltage Vth for the P-channel and N-channel MOS transistors to decrease leak current while suppressing a drop in speed for each logic cell, or to improve speed while suppressing the increase in leak current. By this, general tendencies can be understood before calculating the effects by trying all combinations.

It is also possible to see how the threshold voltage control statistically influences the leak current by using the concept of the probable average leak current. As a result, it is possible to determine an optimum leak current ratio of the P-channel and N-channel from the width ratio β between a typical logic gate on the chip and the P-channel and N-channel MOS transistors. This has an effect of providing one guideline to device development in a situation involving recent processor development where power is increasing.

What is claimed is:

1. A logic cell configuration processing method for a CMOS semiconductor in which leak current per unit width is equal for a P-channel MOS transistor and an N-channel MOS transistor, the method comprising:
    calculating a probable average leak current, which is an expected value of leak current of the P-channel MOS transistor and the N-channel MOS transistor in the logic cell based on an input signal to be input to the logic cell;
    comparing a contribution of the P-channel MOS transistor with a contribution of the N-channel MOS transistor to the calculated probable average leak current;
    deciding the P-channel MOS transistor or the N-channel MOS transistor, whichever has a greater contribution, to be a low leak type MOS transistor; and
    adjusting, by a computer, ON current of the low leak type MOS transistor to be equal to ON current of the other MOS transistor.

2. The logic cell configuration processing method for a CMOS semiconductor according to claim 1, wherein
    an MOS transistor which has a smaller contribution is decided to be a high-speed type MOS transistor in the decision step, and ON current of the low leak type MOS transistor is adjusted to be equal to that of the other MOS transistor in the adjustment step.

3. The logic cell configuration processing method for a CMOS semiconductor according to claim 1, wherein
    an MOS transistor which has a greater contribution is decided to be a low leak type MOS transistor and an MOS transistor which has a smaller contribution is decided to be a high-speed type MOS transistor in the decision step, and ON currents of the low leak type MOS transistor and of the high-speed type MOS transistor are adjusted to be equal to each other in the adjustment step.

4. The logic cell configuration processing method for a CMOS semiconductor according to claim 1, wherein
    the adjustment to be made so that the ON currents become equal is performed by adjusting a transistor width.

5. The logic cell configuration processing method for a CMOS semiconductor according to claim 1, wherein
    the adjustment is made so that the ON currents become equal is performed by adjusting an impurity implantation concentration.

6. The logic cell configuration processing method for a CMOS semiconductor according to claim 1, wherein
    the adjustment to be made so that the ON currents become equal is performed by a substrate bias circuit.

7. The logic cell configuration processing method for a CMOS semiconductor according to claim 1, wherein
    the probable average leak current is a value determined by multiplying a transistor width, leak current per unit width, and a coefficient which indicates leak currents from a plurality of MOS transistors based on the leak current when a predetermined voltage is applied to an MOS transistor having a unit width, and dividing the product by a total number of patterns of input signals to be input to the logic cell, for a P-channel MOS transistor and an N-channel MOS transistor, and adding the respective result values.

8. A logic cell configuration processing method for a CMOS semiconductor which has a P-channel MOS transistor and an N-channel MOS transistor, the method comprising:
    adjusting leak current of the P-channel MOS transistor and the N-channel MOS transistor per unit widths so that a contribution of the P-channel MOS transistor and a contribution of the N-channel MOS transistor become equal in expressions to determine a probable average leak current, which is an expected value of leak current of the P-channel MOS transistor and the N-channel MOS transistor in the logic cell based on an input signal to be input to the logic cell; and
    adjusting, by a computer, a transistor width of the P-channel MOS transistor and the N-channel MOS transistor to obtain a desired ON current.

9. The logic cell configuration processing method for a CMOS semiconductor according to claim 8, wherein
    the probable average leak current is a value determined by multiplying a transistor width, leak current per unit width, and a coefficient which indicates leak currents from a plurality of MOS transistors based on the leak current when a predetermined voltage is applied to an MOS transistor having a unit width, and dividing the product by a total number of patterns of input signals to be input to the logic cell, for a P-channel MOS transistor and an N-channel MOS transistor, and adding the respective result values.

10. The logic cell configuration processing method for a CMOS semiconductor according to claim 8, wherein the logic cell is a majority logic cell in an LSI.

11. A non-transitory computer readable medium, embedded thereon a logic cell configuration processing program for a CMOS semiconductor in which leak current per unit width is equal for a P-channel MOS transistor and an N-channel MOS transistor, the program causing the computer to execute:
    calculating a probable average leak current, which is an expected value of leak current of the P-channel MOS transistor and the N-channel MOS transistor in the logic cell based on an input signal to be input to the logic cell;

comparing a contribution of the P-channel MOS transistor with a contribution of the N-channel MOS transistor to the calculated probable average leak current;

deciding the P-channel MOS transistor or the N-channel MOS transistor, whichever has a greater contribution, to be a low leak type MOS transistor; and adjusting ON current of the low leak type MOS transistor to be equal to ON current of the other MOS transistor.

12. The non-transitory computer readable medium according to claim 11, wherein an MOS transistor which has a smaller contribution is decided to be a high-speed type MOS transistor in the decision step, and ON current of the low leak type MOS transistor is adjusted to be equal to that of the other MOS transistor in the adjustment step.

13. The non-transitory computer readable medium according to claim 11, wherein an MOS transistor which has a greater contribution is decided to be a low leak type MOS transistor and an MOS transistor which has a smaller contribution is decided to be a high-speed type MOS transistor in the decision step, and ON currents of the low leak type MOS transistor and of the high-speed type MOS transistor are adjusted to be equal to each other in the adjustment step.

14. The non-transitory computer readable medium according to claim 11, wherein the adjustment to be made so that the ON currents become equal is performed by adjusting a transistor width.

15. The non-transitory computer readable medium according to claim 11, wherein the probable average leak current is a value determined by multiplying a transistor width, leak current per unit width, and a coefficient which indicates leak currents from a plurality of MOS transistors based on the leak current when a predetermined voltage is applied to an MOS transistor having a unit width, and dividing the product by a total number of patterns of input signals to be input to the logic cell, for a P-channel MOS transistor and an N-channel MOS transistor, and adding the respective result values.

16. A non-transitory computer readable medium, embedded thereon a logic cell configuration processing program for a CMOS semiconductor which has a P-channel MOS transistor and an N-channel MOS transistor, the program causing the computer to execute:

adjusting leak current of the P-channel MOS transistor and the N-channel MOS transistor per unit widths so that a contribution of the P-channel MOS transistor and a contribution of the N-channel MOS transistor become equal in expressions to determine a probable average leak current, which is an expected value of leak current of the P-channel MOS transistor and the N-channel MOS transistor in the logic cell based on an input signal to be input to the logic cell; and adjusting a transistor width of the P-channel MOS transistor and the N-channel MOS transistor to obtain a desired ON current.

17. The non-transitory computer readable medium according to claim 16, wherein the probable average leak current is a value determined by multiplying a transistor width, leak current per unit width, and a coefficient which indicates leak currents from a plurality of MOS transistors based on the leak current when a predetermined voltage is applied to an MOS transistor having a unit width, and dividing the product by a total number of patterns of input signals to be input to the logic cell, for a P-channel MOS transistor and an N-channel MOS transistor, and adding the respective result values.

* * * * *